(12) United States Patent
Sun et al.

(10) Patent No.: US 8,603,304 B2
(45) Date of Patent: Dec. 10, 2013

(54) METHOD FOR MANUFACTURING NICKEL SILICIDE NANO-WIRES

(75) Inventors: Hai-Lin Sun, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/588,222

(22) Filed: Aug. 17, 2012

(65) Prior Publication Data

US 2012/0315761 A1 Dec. 13, 2012

Related U.S. Application Data

(63) Continuation of application No. 12/291,299, filed on Nov. 6, 2008, now Pat. No. 8,349,146.

(30) Foreign Application Priority Data

Apr. 9, 2008 (CN) .......................... 2008 1 0066522

(51) Int. Cl.
*C23C 14/34* (2006.01)

(52) U.S. Cl.
USPC ............ 204/192.12; 204/192.15; 204/192.17; 204/192.25; 204/192.23

(58) Field of Classification Search
USPC ............ 204/192.12, 192.15, 192.17, 192.25, 204/192.23
See application file for complete search history.

(56) References Cited

U.S. PATENT DOCUMENTS 5,203,798 A * 4/1993 Watanabe et al. ............. 134/184

OTHER PUBLICATIONS

Kim, Joondong. "Spontaneous nickel monosilicide nanowire formation by metal induced growth." Feb. 2005.*
Lee, Ki-Hong. "Direct growth of amorphous silica nanowires by solid state transformation of SiO2 films." Dec. 2003.*

* cited by examiner

*Primary Examiner* — Keith Hendricks
*Assistant Examiner* — Jason M Berman
(74) *Attorney, Agent, or Firm* — Altis Law Group, Inc.

(57) ABSTRACT

A method for making nickel silicide nano-wire, the method includes the following steps. Firstly, a silicon substrate and a growing device, and the growing device including a reacting room are provided. Secondly, a silicon dioxide layer is formed on a surface of the silicon substrate. Thirdly, a titanium layer is formed on the silicon dioxide layer. Fourthly, the silicon substrate is placed into the reacting room, and the reacting room is heated to a temperature of 500~1000° C. Finally, a plurality of nickel cluster is formed onto the surface of the silicon substrate.

20 Claims, 5 Drawing Sheets

METHOD FOR MANUFACTURING NICKEL SILICIDE NANO-WIRES

RELATED APPLICATIONS

This application is a continuation application of U.S. patent application Ser. No. 12/291,299, filed on Nov. 6, 2008, and entitled, "METHOD FOR MANUFACTURING NICKEL SILICIDE NANO-WIRES," which claims all benefits accruing under 35 U.S.C. §119 from China Patent Application No. 200810066522.6, filed on Apr. 9, 2008 in the China Intellectual Property Office

BACKGROUND

1. Technical Field

The present disclosure relates to methods for making nano materials and, particularly, to a method for making a nickel silicide (NiSi) nano-wires.

2. Discussion of Related Art

Nickel silicide is promising for use as a new interconnecting material due to its low electrical resistivity and high thermal stability. Therefore, achieving various shapes of nickel silicide nano materials is desirable.

A conventional method for making nickel silicide nano-wires includes the following steps. Firstly, providing a silicon wafer as growing substrate. Secondly, forming a layer of catalyst on the silicon wafer. Thirdly, putting the silicon wafer in to a furnace and introducing a silicon-containing gas therein. Fourthly, heating the furnace to a temperature of 500~1100° C. to fabricate silicon nano-wires. Fifthly, depositing a layer of nickel on the silicon nano-wires. Finally, controlling the temperature of furnace to 550° C. to achieve nickel silicide nano-wires.

However, there are some drawbacks in using this method. Firstly, silicon-containing gas is harmful to the environment. Secondly, the method cannot control the diameter of the nickel silicide nano-wires. Thirdly, it is a time-consuming method.

What is needed, therefore, is an efficient method for making the nickel silicide nano-wire that is environmental friendly.

BRIEF DESCRIPTION OF THE DRAWINGS

Many aspects of the present method for making the nickel silicide nano-wire can be better understood with references to the following drawings. The components in the drawings are not necessarily drawn to scale, the emphasis instead being placed upon clearly illustrating the principles of the present method for making the nickel silicide nano-wire.

Figure 1:
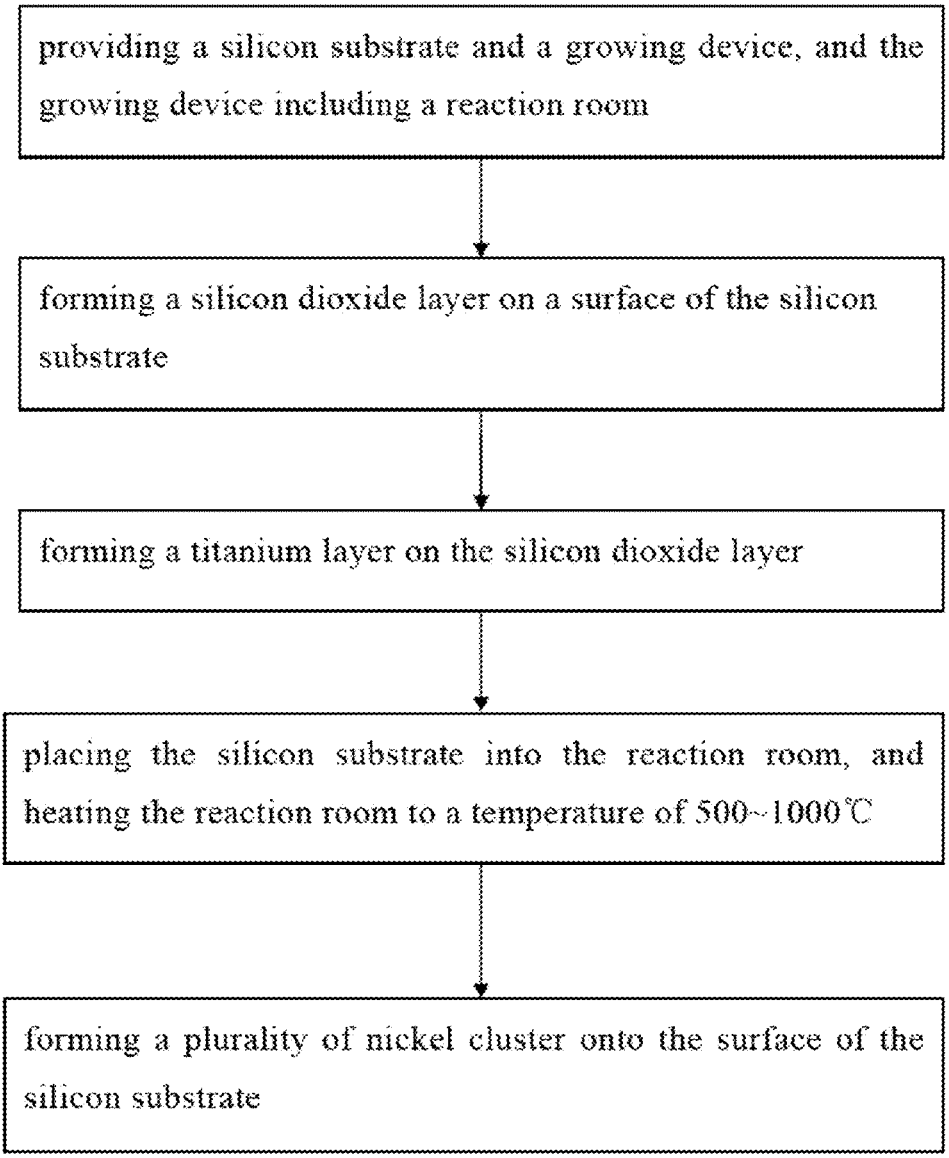
FIG. 1 is a flow chart of a method for making a nickel silicide nano-wire, in accordance with a present embodiment.

Corresponding reference characters indicate corresponding parts throughout the several views. The exemplifications set out herein illustrate at least one embodiment of the present method for making the nickel silicide nano-wire, in at least one form, and such exemplifications are not to be construed as limiting the scope of the disclosure in any manner.

DETAILED DESCRIPTION

References will now be made to the drawings to describe, in detail, various embodiments of the present method for making a nickel silicide nano-wire.

Figure 2:
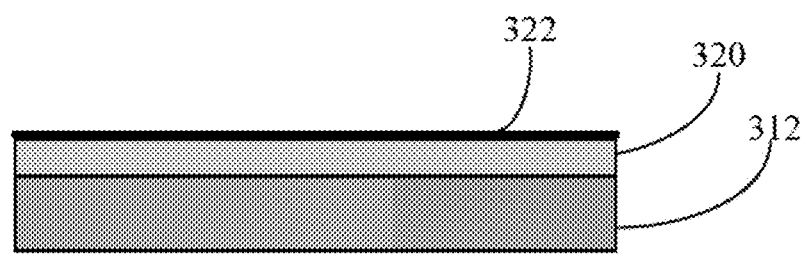
FIG. 2 is a schematic view of a silicon substrate formed with a silicon dioxide layer and a titanium layer used for making the nickel silicide nano-wire of FIG. 1.
Figure 3:
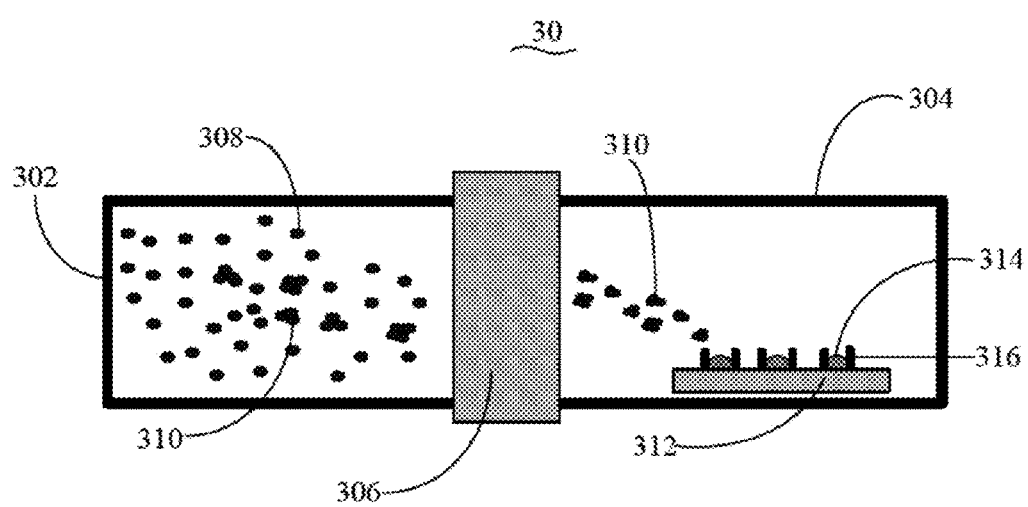
FIG. 3 is a schematic view of a growing device used for making the nickel silicide nano-wire of FIG. 1.

Referring to FIGS. 1, 2 and 3, a method for making a nickel silicide nano-wire 316 according to the present embodiment includes the following steps:

(a) providing a silicon substrate 312 and a growing device 30 that includes a reacting room 304;

(b) forming a silicon dioxide layer 320 on a surface of the silicon substrate 312;

(c) forming a titanium layer 322 on the silicon dioxide layer 320;

(d) placing the silicon substrate 312 into the reacting room 304, and heating the reacting room 304 to a temperature of 500~1000° C.; and (e) forming a plurality of nickel clusters 310 on the surface of the silicon substrate 312.

In step (a), the silicon substrate 312 is a silicon wafer. The size and shape of the silicon substrate 312 are arbitrary and can be selected according to need. The silicon substrate 312 is cleaned by ultrasonic vibration before forming a silicon dioxide layer 320 thereon. The period of time for cleaning the silicon substrate 312 ranges from approximately 5 to 10 minutes.

In step (a), the growing device 30 further includes a sputtering device (not shown). The sputtering device includes a sputtering room 302. The sputtering room 302 is intercommunicated with the reacting room 304 via a quadrupole mass spectrometer 306. The sputtering device is used to provide Ni particles. In the present embodiment, the sputtering device is a Magnetron Sputtering Device. The growing device 30 further includes a heating device (not shown) to heat the reacting room 304 and a vacuumization system (not shown) to vacuumize the reacting room 304.

In step (b), the silicon dioxide layer 320 can be formed via placing the silicon substrate 312 in an oxygenic environment for about 30 to 120 minutes. The thickness of the silicon dioxide layer 320 ranges approximately from 10 nanometers to 1 micrometer. In the present embodiment, the thickness of the silicon dioxide layer 320 is 500 nanometers. It is to be understood that a process of heating the silicon substrate 312 can be carried out to increase the velocity of forming silicon dioxide layer 320.

In step (c), the method for forming the titanium layer 322 can be selected from chemical vapor deposition (CVD), sputtering, and plasma-assisted chemical vapor deposition among other acceptable methods. The thickness of the titanium layer 322 ranges approximately from 1 to 500 nanometers. In the present embodiment, a titanium layer 322 of 50 nanometers is formed on the silicon dioxide layer 320 by sputtering.

In step (d), the silicon substrate 312 can be placed anywhere in the reacting room 304 as long as the nickel cluster 310 introduced in the step (e) can achieve the titanium layer 322. After placing the silicon substrate 312 in the reacting room 304, air pressure in the reacting room 304 is reduced to lower than $1 \times 10^{-3}$ Pa. The rate of temperature increase in the reacting room 304 is controlled to be 10° C. per minute.

In step (d), the reacting room 304 is kept at a temperature between 500~1000° C. for about 2 to 10 minutes. During this time, the silicon dioxide layer 320 reacts with the titanium layer 322 to form a plurality of island-shape titanium silicide ($TiSi_2$) structure 314. A portion of the silicon substrate 312 which is not covered by the island-shape titanium silicide structure 314 is exposed to the environment. The size of the island-shape titanium silicide structure 314 depends on the thickness of the silicon dioxide layer 320 and the titanium layer 322. The size of the island-shape titanium silicide structure 314 will affect the diameter of the nickel silicide nano-wires 316 fabricated in step (e). The bigger the size of the island-shape titanium silicide structure 314 is, the larger the diameter of the nickel silicide nano-wires 316 will be. In the present embodiment, the thickness of the silicon dioxide layer 320 is 500 nanometers, the thickness of the titanium layer 322 is 50 nanometers, and the effective diameter of the island-shape titanium silicide structure 314 ranges approximately from 500 nanometers to 1 micrometer.

Step (e) includes the following substeps of (e1) forming a plurality of nickel clusters 310; (e2) filtering the nickel clusters 310; and (e3) depositing the nickel clusters 310 on the silicon substrate 312.

In step (e1), the nickel clusters 310 are formed using the Magnetron Sputtering Device. After a plurality of Ni particles 308 are sputtered out of the Ni target, the Ni particles 308 move freely in the sputtering room 302, collide with each other and aggregate to form a plurality of nickel clusters 310. The working gas in the present embodiment comprises argon (Ar) gas. The working gas pressure in the sputtering room 302 ranges approximately from $1 \times 10^{-1}$ Pa to $9 \times 10^{-1}$ Pa.

In step (e2), the gas pressure in the sputtering room 302 is higher than the pressure in the reacting room 304. The nickel clusters 310 diffuse from the sputtering room 302 to the reacting room 304 via the quadrupole mass spectrometer 306. The quadrupole mass spectrometer 306 can select the nickel clusters 310 in different mass numbers.

In step (e1), the nickel clusters 310 of a predetermined mass number pass through the quadrupole mass spectrometer 306. The nickel clusters 310 diffuse continuously after getting into the reacting room 304. When the nickel clusters 310 makes contacts with the silicon substrate 312, the nickel clusters 310 deposit thereon and react with the silicon substrate 312 to fabricate nickel silicide nano-wires 316. The mass numbers of the nickel clusters 310 depend on the size of the island-shape titanium silicide structure 314. The bigger the size of the island-shape titanium silicide structure 314 is, the larger the mass number of the nickel clusters 310 should be. The size of the island-shape titanium silicide structure 314 depends on the thickness of the silicon dioxide layer 320 and the titanium layer 322. Therefore, the nickel silicide nano-wires 316 in different diameters can be fabricated by controlling the thickness of the silicon dioxide layer 320, the titanium layer 322 and mass numbers of the nickel clusters 310. The bigger the thickness of the silicon dioxide layer 320 and the titanium layer 322 is, the larger the diameter of the nickel silicide nano-wires 316 will be. The length of the nickel silicide nano-wires 316 depends on the growing time. The greater the growing time is, the longer the nickel silicide nano-wires 316 will be.

Figure 4:
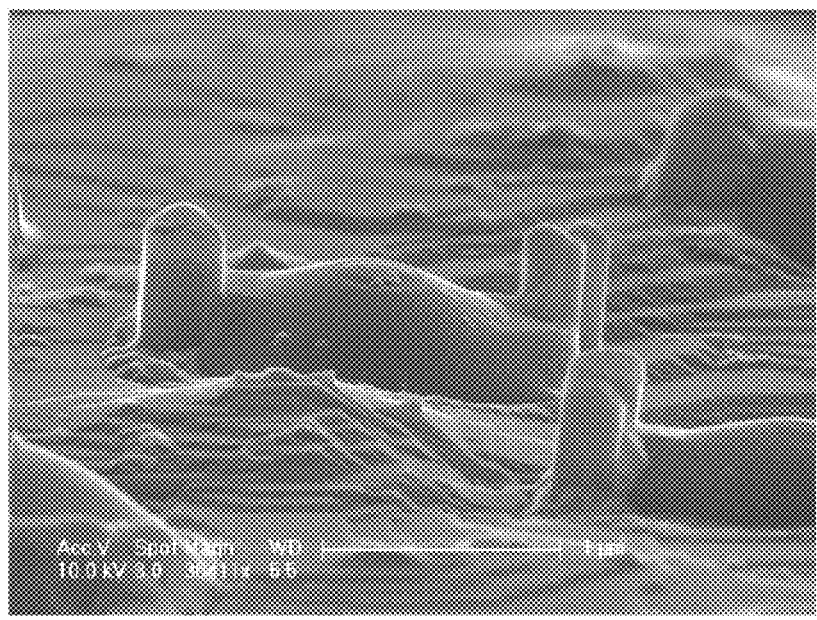
FIGS. 4 and 5 show Scanning Electron Microscope (SEM) images of the nickel silicide nano-wire formed by the method of FIG. 1.
Figure 5:
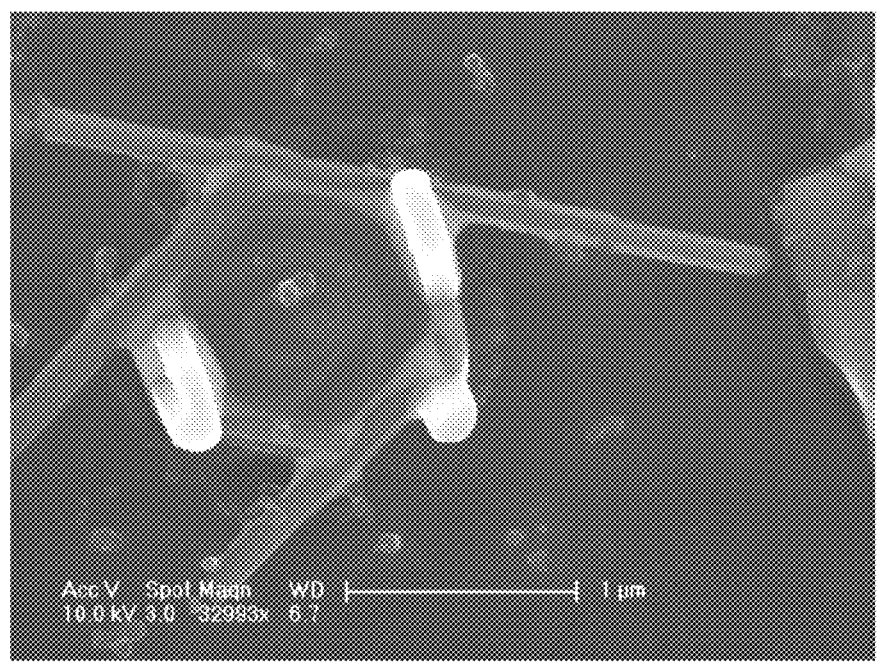

In the present embodiment, the nickel clusters 310 of predetermined mass numbers of 7000~9000 are used to fabricate nickel silicide nano-wires 316. Referring to FIGS. 4 and 5, the nickel silicide nano-wires 316 grow along the side of the island-shape titanium silicide structure 314. The nickel silicide nano-wires 316 can grow perpendicular to or parallel to the surface of the silicon substrate 312. The length of the nickel silicide nano-wires 316 ranges approximately from 100 nanometers to 2 micrometers. The diameter of the nickel silicide nano-wires 316 ranges approximately from 10 to 500 nanometers.

The present method for making the nickel silicide nano-wires has many advantages including the following. Firstly, the nickel clusters 310 are directly formed on the silicon substrate to fabricate nickel silicide nano-wires, thereby simplifying the process and reducing costs. Secondly, there is no need for silicon-containing gas; thereby the present method is environmental friendly. Thirdly, diameters of the nickel silicide nano-wires are controllable.

It is to be understood that the above-described embodiments are intended to illustrate, rather than limit, the disclosure. Variations may be made to the embodiments without departing from the spirit of the disclosure as claimed. The above-described embodiments illustrate the scope of the disclosure but do not restrict the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for making nickel suicide nano-wire, the method comprising steps of:
    (a) forming a silicon dioxide layer on a surface of a silicon substrate;
    (b) forming a titanium layer on the silicon dioxide layer;
    (c) placing the silicon substrate into a reacting room;
    (d) heating the reacting room to a temperature of 500° C. to 1000° C.; and
    (e) supplying a plurality of nickel clusters onto the surface of the silicon substrate.

2. The method of claim 1, wherein the silicon substrate is a silicon wafer.

3. The method of claim 1, wherein the silicon substrate is cleaned by ultrasonic vibration.

4. The method of claim 1, wherein the forming the silicon dioxide layer comprises placing the silicon substrate in an environment comprising oxygen.

5. The method of claim 4, wherein the forming the silicon dioxide layer further comprises heating the silicon substrate in the environment comprising oxygen.

6. The method of claim 1, wherein a thickness of the silicon dioxide layer ranges from about 10 nanometers to about 1 micrometer.

7. The method of claim 1, wherein the forming the titanium layer is performed by a process selected from the group consisting of chemical vapor deposition, sputtering, and plasma-assisted chemical vapor deposition.

8. The method of claim 1, wherein a thickness of the titanium layer ranges from about 1 nanometer to about 500 nanometers.

9. The method of claim 1, wherein an air pressure of the reacting room is lower than $1 \times 10^{-3}$ Pa.

10. The method of claim 1, wherein a temperature of the reacting room is increased at a rate of about 10° C. per minute.

11. The method of claim 1, wherein the reacting room is kept at the temperature for a time in a range from about 2 minutes to about 10 minutes before the supplying the plurality of nickel clusters.

12. A method for making nickel silicide nano-wire, the method comprising steps of:
    (a) forming a silicon dioxide layer on a surface of a silicon substrate;
    (b) depositing a titanium layer on the silicon dioxide layer;
    (c) making the silicon dioxide layer reacting with the titanium layer to grow a plurality of island-shaped titanium silicide structures by heating the silicon substrate having the titanium layer thereon to a temperature of 500° C. to 1000° C.;

(e) maintaining the temperature and supplying a plurality of nickel cluster onto the surface of the silicon substrate to grow a plurality of nickel silicide nano-wires.

13. The method of claim 12, wherein a thickness of the silicon dioxide layer ranges from about 10 nanometers to about 1 micrometer.

14. The method of claim 12, wherein a thickness of the titanium layer ranges from about 1 to about 500 nanometers.

15. The method of claim 12, wherein in step (c), the silicon substrate having the titanium layer thereon is placed in a reacting room with an air pressure lower than $1 \times 10^{-3}$ Pa.

16. The method of claim 15, wherein the reacting room is heated to rise temperature at a rate of about 10° C. per minute and the reacting room is kept at the temperature for a time in a range from about 2 minutes to about 10 minutes.

17. The method of claim 12, wherein diameters of the plurality of island-shaped titanium silicide structures are in a range from about 500 nanometers to about 1 micrometer.

18. The method of claim 12, wherein a portion of the silicon substrate is exposed from the plurality of island-shaped titanium silicide structures to form an exposed silicon substrate, and the plurality of nickel cluster is in contact and react with the exposed silicon substrate to fabricate a plurality of nickel silicide nano-wires.

19. The method of claim 12, wherein each of the plurality of nickel silicide nano-wires grows along a side of one of the plurality of island-shapes titanium silicide structures.

20. The method of claim 19, wherein each of the plurality of nickel silicide nano-wires grows along a direction perpendicular to or parallel to the surface of the silicon substrate.

* * * * *